United States Patent
Kim et al.

(10) Patent No.: US 8,154,323 B2
(45) Date of Patent: Apr. 10, 2012

(54) OUTPUT DRIVER OPERABLE OVER WIDE RANGE OF VOLTAGES

(75) Inventors: Eon-guk Kim, Seoul (KR); Dae-gyu Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 12/771,034

(22) Filed: Apr. 30, 2010

(65) Prior Publication Data
US 2011/0025380 A1  Feb. 3, 2011

(30) Foreign Application Priority Data
Jul. 29, 2009  (KR) .................. 10-2009-0069494

(51) Int. Cl.
*H03B 1/00* (2006.01)
(52) U.S. Cl. .................. 327/108; 327/112
(58) Field of Classification Search .......... None
See application file for complete search history.

(56) References Cited

U.S. PATENT DOCUMENTS

| | | | |
|---|---|---|---|
| 5,072,363 A | 12/1991 | Gallagher | |
| 6,570,405 B1 * | 5/2003 | Lien | 326/83 |
| 6,647,449 B1 | 11/2003 | Watts | |
| 6,954,812 B2 | 10/2005 | Lavigne | |
| 8,026,745 B2 * | 9/2011 | Scott et al. | 327/108 |
| 2004/0179535 A1 | 9/2004 | Bertagna | |
| 2004/0258086 A1 | 12/2004 | Kurupati | |
| 2005/0138055 A1 | 6/2005 | Handlogten et al. | |
| 2009/0027089 A1 * | 1/2009 | Hebenstreit | 327/108 |

FOREIGN PATENT DOCUMENTS

| | | |
|---|---|---|
| JP | 2000-295089 | 10/2000 |
| JP | 2001-186006 | 7/2001 |
| JP | 2001-223575 | 8/2001 |
| KR | 1019930003929 B1 | 5/1993 |

* cited by examiner

*Primary Examiner* — Cassandra Cox
(74) *Attorney, Agent, or Firm* — Myers Bigel Sibley & Sajovec, P.A.

(57) ABSTRACT

An output driver includes a pull-up circuit and a pull-down circuit coupled to an output terminal and a capacitor having a first terminal coupled to a gate terminal of a P-channel transistor of the pull-up circuit and a second terminal configured to receive a drive signal. The output driver further includes a drive circuit coupled to the first terminal of the capacitor and configured to transfer charge from a power supply node to the first terminal of the capacitor when the drive signal is at a signal ground voltage and to decouple the first terminal of the capacitor from the power supply node when the drive signal is at a voltage level greater than the signal ground voltage such that a voltage swing of a signal generated at the gate terminal of the P-channel transistor is constrained to be less than a voltage of the power supply node with respect to the signal ground voltage.

16 Claims, 9 Drawing Sheets

OUTPUT DRIVER OPERABLE OVER WIDE RANGE OF VOLTAGES

CROSS-REFERENCE TO RELATED APPLICATIONS

The present application claims the benefit of Korean Patent Application No. 10-2009-0069494, filed on Jul. 29, 2009, in the Korean Intellectual Property Office, the disclosure of which is incorporated herein in its entirety by reference.

BACKGROUND

The inventive subject matter relates to an output driver of an electronic circuit, and more particularly, to an output driver operable over a wide range of voltages.

In general, there exist devices operating at various supply voltages in an electronic circuit. Accordingly, building an input/output interface circuit requires an output driver that can normally operate over a wide range of supply voltages.

SUMMARY

Some embodiments of the inventive subject matter provide an output driver including a pull-up circuit and a pull-down circuit coupled to an output terminal and a capacitor having a first terminal coupled to a gate terminal of a P-channel transistor of the pull-up circuit and a second terminal configured to receive a drive signal. The output driver further includes a drive circuit coupled to the first terminal of the capacitor and configured to transfer charge from a power supply node to the first terminal of the capacitor when the drive signal is at a signal ground voltage and to decouple the first terminal of the capacitor from the power supply node when the drive signal is at a voltage level greater than the signal ground voltage such that a voltage swing of a signal generated at the gate terminal of the P-channel transistor is constrained to be less than a voltage of the power supply node with respect to the signal ground voltage.

In some embodiments, the pull-up circuit may be coupled between the output terminal and the power supply node and the drive circuit may include a PMOS transistor having a source terminal coupled to the power supply node, a drain terminal coupled to the first terminal of the capacitor and a gate terminal configured to receive a signal complementary to the drive signal. In further embodiments, the pull-up circuit is coupled between the output terminal and a first power supply node and the drive circuit includes a PMOS transistor having a source terminal coupled to a second power supply node, a drain terminal coupled to the first terminal of the capacitor and a gate terminal configured to receive a signal complementary to the drive signal. The second power supply node may have a voltage less than a voltage of the first power supply node.

In some embodiments, the pull-up circuit may include a first PMOS transistor having a source terminal coupled to a first power supply node and a second PMOS transistor having a source terminal coupled to a drain terminal of the first PMOS transistor and a drain terminal coupled to the output terminal. The capacitor may include a first capacitor having a first terminal coupled to a gate terminal of the first PMOS transistor and a second terminal configured to receive a first drive signal and a second capacitor having a first terminal coupled to a gate terminal of the second PMOS transistor and a second terminal configured to receive a second drive signal. The drive circuit may include a third PMOS transistor having a source terminal coupled to the first power supply node, a drain terminal coupled to the first terminal of the first capacitor and a gate terminal configured to receive a signal complementary to the first drive signal and a fourth PMOS transistor having a source terminal coupled to a second power supply node, a drain terminal coupled to the first terminal of the second capacitor and a gate terminal configured to receive a signal complementary to the second drive signal. The second power supply node may have a voltage less than a voltage of the first power supply node.

Some embodiments of the inventive subject matter provide an output driver that can operate over a wide range of supply voltages and protect devices against overvoltage.

The inventive subject matter also provides an output driver that can operate over a wide range of supply voltages and perform a tolerant function and a fail-safe function.

According to an aspect of the inventive subject matter, there is provided an output driver operable over a wide range of voltages, the output driver including: pull-up/pull-down circuits connecting one or more P-channel transistors between a first supply voltage terminal and an output terminal in a cascode configuration, connecting one or more N-channel transistors between the output terminal and a ground terminal in a cascode configuration, and determining a voltage of the output terminal according to voltages of signals applied to gate terminals of the one or more P-channel transistors and the one or more N-channel transistors; and a gate voltage adjusting circuit connecting at least one capacitor between a terminal to which a first signal swinging between a first voltage and a second supply voltage that is lower than a first supply voltage is applied and the gate terminals of the one or more P-channel transistors included in the pull-up/pull-down circuits, and changing the first signal to a second signal swinging between the first voltage and a second voltage that is higher than the first voltage and lower than the first supply voltage or to a third signal swinging between the second supply voltage and a third voltage that is higher than the first voltage and lower than the second supply voltage based on charge sharing between internal capacitors of the one or more P-channel transistors and the capacitor to apply the second signal or the third signal to the gate terminals of the one or more P-channel transistors included in the pull-up/pull-down circuits.

The gate voltage adjusting circuit may include: a first capacitor connected between a terminal to which the first signal is applied and a first node; and a P-channel transistor having a first terminal connected to the first supply voltage source terminal, a second terminal connected to the first node, and a gate terminal to which a fourth signal swinging between the first supply voltage and a fourth voltage that is higher than the first voltage and lower than the first supply voltage is applied, wherein the first node is connected to the gate terminals of the one or more P-channel transistor included in the pull-up/pull-down circuits, and the fourth signal and the first signal complementary.

The gate voltage adjusting circuit may include: a second capacitor connected between a terminal to which the first signal is applied and a second node; and a P-channel transistor having a first terminal connected to the second supply voltage source terminal, a second terminal connected to the second node, and a gate terminal to which a fifth signal swinging between the second supply voltage and a fifth voltage that is higher than the first voltage and lower than the second supply voltage is applied, wherein the second node is connected to the gate terminals of the one or more P-channel transistors included in the pull-up/pull-down circuits, and the fifth signal and the first signal are complementary.

The gate voltage adjusting circuit may include: a first circuit receiving the first signal to generate the first supply voltage at a third terminal when the first signal changes from the first voltage to the second supply voltage, to generate the second voltage, which is higher than the first voltage and lower than the first supply voltage, at the third terminal when the first signal changes from the second supply voltage to the first voltage, and making the third terminal float when the first signal is maintained in a direct current (DC) state; and a stabilizing circuit maintaining the third terminal at an initially set voltage in a floating state when the first signal is maintained in a DC state.

The pull-up/pull-down circuits may be configured such that a second supply voltage source terminal is connected to a gate terminal of at least one N-channel transistor from among the one or more N-channel transistors connected in the cascode configuration.

The pull-up/pull-down circuits may further include a P-channel transistor having a terminal connected to a gate terminal of at least one N-channel transistor from among the one or more N-channel transistors and a second supply voltage source terminal, and connected between a gate terminal and one terminal of the N-channel transistor connected to the second supply voltage terminal, wherein the second signal having the same phase as that of the first signal is applied to a gate terminal of the P-channel transistor further included in the pull-up/pull-down circuits.

The transistors may be designed to operate at the second supply voltage. The transistors may include metal oxide semiconductor (MOS) transistors.

According to another aspect of the inventive subject matter, there is provided an output driver operable over a wide range of voltages, the output driver including: a control signal generating circuit generating first, second, and third control signals according to an on/off state of a first supply voltage source and a second supply voltage source through current paths due to a plurality of transistors connected between a pad and a first supply voltage source terminal, wherein when both the first supply voltage source and the second supply voltage source are turned on, the first control signal generates a second supply voltage, the second control signal generates a first supply voltage, and the third control signal generates the first supply voltage if a voltage of the pad is higher than the first supply voltage and generates the same voltage as the voltage of the pad if the voltage of the pad is not higher than the first supply voltage, and when both the first supply voltage source and the second supply voltage source are turned off, each of the first and second control signals generates a voltage that is lower by an initially set voltage than the voltage of the pad, and the third control signal generates the same voltage as the voltage of the pad; pull-up/pull-down circuits connecting one or more P-channel transistors between the first supply voltage source terminal and the pad in a cascode configuration, connecting one or more N-channel transistors between the pad and a ground terminal in a cascode configuration, and determining the voltage of the pad according to voltages of signals applied to gate terminals of the one or more P-channel transistors and the one or more N-channel transistors; and a device protecting circuit including a plurality of switching units coupled to the pull-up/pull-down circuits, and preventing current from flowing to the first supply voltage source terminal from the pad when a voltage that is higher than the first supply voltage is applied to the pad or when the first supply voltage is applied to the pad in the state where the first and second supply voltage sources are turned off by turning on or turning off the plurality of switching units using the first, second, and third signals.

The output driver may further include a gate voltage adjusting circuit changing a first signal swinging between a first voltage and the second supply voltage that is lower than the first supply voltage to a second signal swinging between the first supply voltage and a second voltage that is higher than the first voltage and lower than the first supply voltage or to a third signal swinging between the second supply voltage and a third voltage that is higher than the first voltage and lower than the second supply voltage to apply the second signal or the third signal to the gate terminals of the one or more P-channel transistors included in the pull-up/pull-down circuits.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
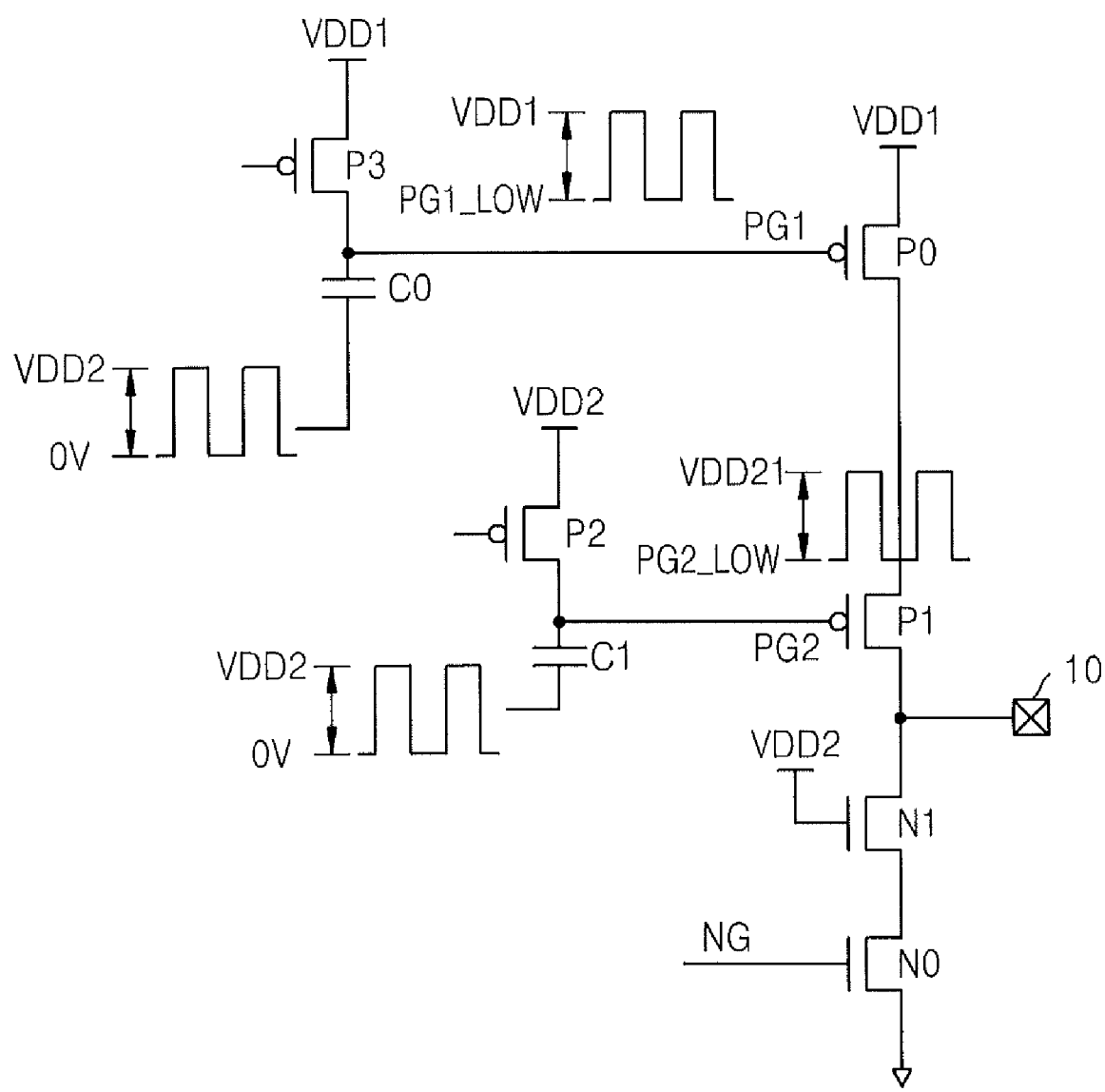
FIG. 1 is a partial circuit diagram for explaining the operating principle of an output driver according to some embodiments of the inventive subject matter.

In order to fully understand operational advantages of the inventive subject matter and objects that may be attained by embodiments of the inventive subject matter, the accompanying drawings illustrating exemplary embodiments of the inventive subject matter and details described in the accompanying drawings should be referred to.

Some embodiments provide an output driver that includes devices designed to operate at a second supply voltage and can operate in a range from the second supply voltage to a first supply voltage that is higher than the second supply voltage. For example, the second supply voltage may be set to 1.8 V and the first supply voltage may be set to 3.3 V. In the drawings, the first supply voltage is denoted by VDD1 and the second supply voltage is denoted by VDD2. However, the inventive subject matter is not limited thereto, and various other supply voltages may be used. For convenience of explanation, it is assumed that the first supply voltage VDD1 is set to 3.3 V and the second supply voltage VDD2 is set to 1.8 V.

FIG. 1 is a partial circuit diagram of an output driver according to some embodiments of the inventive subject matter. Metal oxide semiconductor (MOS) devices illustrated in FIG. 1 may be designed to operate at the second supply voltage VDD2 of 1.8 V.

Referring to FIG. 1, PMOS transistors P0 and P1 are connected between a first supply voltage terminal and a pad 10 in a cascode configuration, and NMOS transistors N1 and N0 are connected between the pad 10 and a ground terminal in a cascode configuration. The PMOS transistors P0 and P1 serve as pull-up transistors, and the NMOS transistors N1 and N0 serve as pull-down transistors. The PMOS transistors P0 and P1 are P-channel MOS transistors and the NMOS transistors N1 and N0 are N-channel MOS transistors.

A PMOS transistor P3 has a drain terminal connected to a gate terminal PG1 of the PMOS transistor P0, a source terminal connected to the first supply voltage terminal, and a gate terminal to which a signal, which swings between the first supply voltage VDD1 and a voltage that is higher than a ground voltage of 0 V and lower than the first supply voltage VDD1 and can turn on the PMOS transistor P3, is applied. For example, the signal applied to the gate terminal of the PMOS transistor P3 may be a signal output from a level shifter 20 of FIG. 3.

A capacitor C0 has a first terminal connected to the gate terminal PG1 of the PMOS transistor P0, and a second terminal to which a signal that swings between the ground voltage of 0 V and the second supply voltage VDD2 is applied as shown in FIG. 1.

The signal applied to the gate terminal of the PMOS transistor P3 and the signal applied to the second terminal of the capacitor C0 are complementary (i.e., one is inverted with respect to the other).

A PMOS transistor P2 has a drain terminal connected to a gate terminal PG2 of the PMOS transistor P1, a source terminal connected to a second supply voltage terminal, and a gate terminal to which a signal that swings between the second supply voltage VDD2 and a voltage that is higher than the ground voltage of 0 V and lower than the second supply voltage VDD2 and can turn on the PMOS transistor P2 is applied.

A capacitor C1 has a first terminal connected to the gate terminal PG2 of the PMOS transistor P1, and a second terminal to which a signal that swings between the ground voltage of 0 V and the second supply voltage VDD2 is applied as shown in FIG. 1.

The signal applied to the gate terminal of the PMOS transistor P2 and the signal applied to the second terminal of the capacitor C1 are complementary.

The operation of the output driver of FIG. 1 will now be explained in detail.

Overvoltage can be prevented from being applied to a gate-oxide of the PMOS transistor P1 and the NMOS transistor N1 by applying the second supply voltage VDD2 to the gate terminal PG2 of the PMOS transistor P1 and the gate terminal of the NMOS transistor N1 near the pad 10. However, if the second supply voltage VDD2 is applied to the gate terminal PG2 of the PMOS transistor P1, since a source-gate voltage Vsg of the PMOS transistor P1 is determined by a potential difference between the first supply voltage VDD1 and the second supply voltage VDD2, the source-gate voltage Vsg of the PMOS transistor P1 is directly affected by a change in the first supply voltage VDD1 and the second supply voltage VDD2. For example, if each of the first supply voltage VDD1 and the second supply voltage VDD2 has a change of ±10%, the source-gate voltage Vsg of the PMOS transistor P1 is reduced to 0.99 V (2.97 V–1.98 V), thereby making it difficult to generate a sufficient amount of pull-up driving current.

For that reason, the second supply voltage terminal is not directly connected to the gate terminal PG2 of the PMOS transistor P1, and a circuit including the PMOS transistor P2 and the capacitor C1 is used to generate a gate driving signal.

As described above, the signal swinging between the ground voltage of 0 V and the second supply voltage VDD2 is applied to the second terminal of the capacitor C1, and the signal applied to the gate terminal of the PMOS transistor P2 and the signal applied to the second terminal of the capacitor C1 are complementary.

If the second supply voltage VDD2 is applied to the second terminal of the capacitor C1, since the voltage that is higher than the ground voltage of 0 V and lower than the second supply voltage VDD2 and can turn on the PMOS transistor P2 is applied to the gate terminal of the PMOS transistor P2, the PMOS transistor P2 is turned on and the second supply voltage VDD2 is supplied to the gate terminal PG2 of the PMOS transistor P1.

If the ground voltage of 0 V is applied to the second terminal of the capacitor C1, since the second supply voltage VDD2 is applied to the gate terminal of the PMOS transistor P2, the PMOS transistor P2 is turned off and a voltage PG2_LOW of the gate terminal PG2 of the PMOS transistor P1 becomes as follows:

$$PG2\_LOW = [VDD2 - VDD2 * C1/(C1 + Cg(P1))] \quad (1)$$

where Cg(P1) is the value of an internal capacitor of the gate terminal of the PMOS transistor P1.

Accordingly, instead of the signal swinging between the ground voltage of 0 V and the second supply voltage VDD2, a signal swinging between the voltage PG2_LOW and the second supply voltage VDD2 is applied to the gate terminal PG2 of the PMOS transistor P1 as shown in FIG. 1. Accordingly, even if PMOS transistors designed to operate at the second supply voltage VDD2 are used, overvoltage can be prevented from being applied to both the ends of the gate-oxide of the PMOS transistor P1.

Referring to Equation 1, a sufficient amount of pull-up driving current can be generated without causing the source-gate voltage Vsg of the PMOS transistor P1 to exceed a rated voltage by adjusting the value of the capacitor C1. For example, as the first supply voltage VDD1 decreases from 3.3 V to 2.5 V or 1.8 V, the voltage PG2_LOW may be further reduced in order to obtain the source-gate voltage Vsg of the PMOS transistor P1 that can sufficiently drive the PMOS transistor P1. Accordingly, the voltage PG2_LOW is reduced by increasing the value of the capacitor C1.

Overvoltage can be prevented from being applied to the gate-oxide of the PMOS transistor P0. A gate driving signal is generated using a circuit including the PMOS transistor P3 and the capacitor C0 as shown in FIG. 1. As described above, the signal swinging between the ground voltage of 0 V and the second supply voltage VDD2 is applied to the second terminal of the capacitor C0, and the signal applied to the gate terminal of the PMOS transistor P3 and the signal applied to the second terminal of the capacitor C0 are complementary.

If the second supply voltage VDD2 is applied to the second terminal of the capacitor C0, since the voltage that is higher than the ground voltage of 0 V and lower than the first supply voltage VDD1 and can turn on the PMOS transistor P3 is applied to the gate terminal of the PMOS transistor P3, the PMOS transistor P3 is turned on and the first supply voltage VDD1 is applied to the gate terminal PG1 of the PMOS transistor P0. Accordingly, the PMOS transistor P0 is turned off. If the ground voltage of 0 V is applied to the second terminal of the capacitor C0, since the PMOS transistor P3 is turned off when the first supply voltage VDD1 is applied to the gate terminal of the PMOS transistor P3, a voltage PG1_LOW of the gate terminal of the PMOS transistor P0 becomes as follows.

$$PG1\_LOW=[VDD1-VDD2*C0/(C0+Cg(P0))] \quad (2)$$

where Cg(P0) is the value of an internal capacitor of the gate terminal of the PMOS transistor P0.

Accordingly, instead of the signal swinging between the ground voltage of 0 V and the first supply voltage VDD1, a signal swinging between the voltage PG1_LOW and the first supply voltage VDD1 is applied to the gate terminal PG1 of the PMOS transistor P0 as shown in FIG. 1. Accordingly, even if PMOS transistors designed to operate at the second supply voltage VDD2 are used, overvoltage can be prevented from being applied to gate-oxide of the PMOS transistor P0. Referring to Equation 2, a sufficient amount of pull-up driving current can be generated without causing a source-gate voltage Vsg of the PMOS transistor P0 to exceed the rated voltage by adjusting the value of the capacitor C0.

If a signal swinging between the ground voltage of 0 V and the second supply voltage VDD2 is applied to a node NG, that is, a gate terminal of the NMOS transistor N0, which is a pull-down transistor, normal operations can be performed. Also, when the NMOS transistor N0 is driven, overvoltage is not applied to the gate-oxide of the NMOS transistor N0.

However, when the second supply voltage VDD2 is applied to the node NG to drive the NMOS transistors N0 and N1, which constitute a pull-down circuit, a gate length needs to be long enough to prevent deterioration of the characteristics of the NMOS transistor N1 due to hot carriers.

Figure 2:
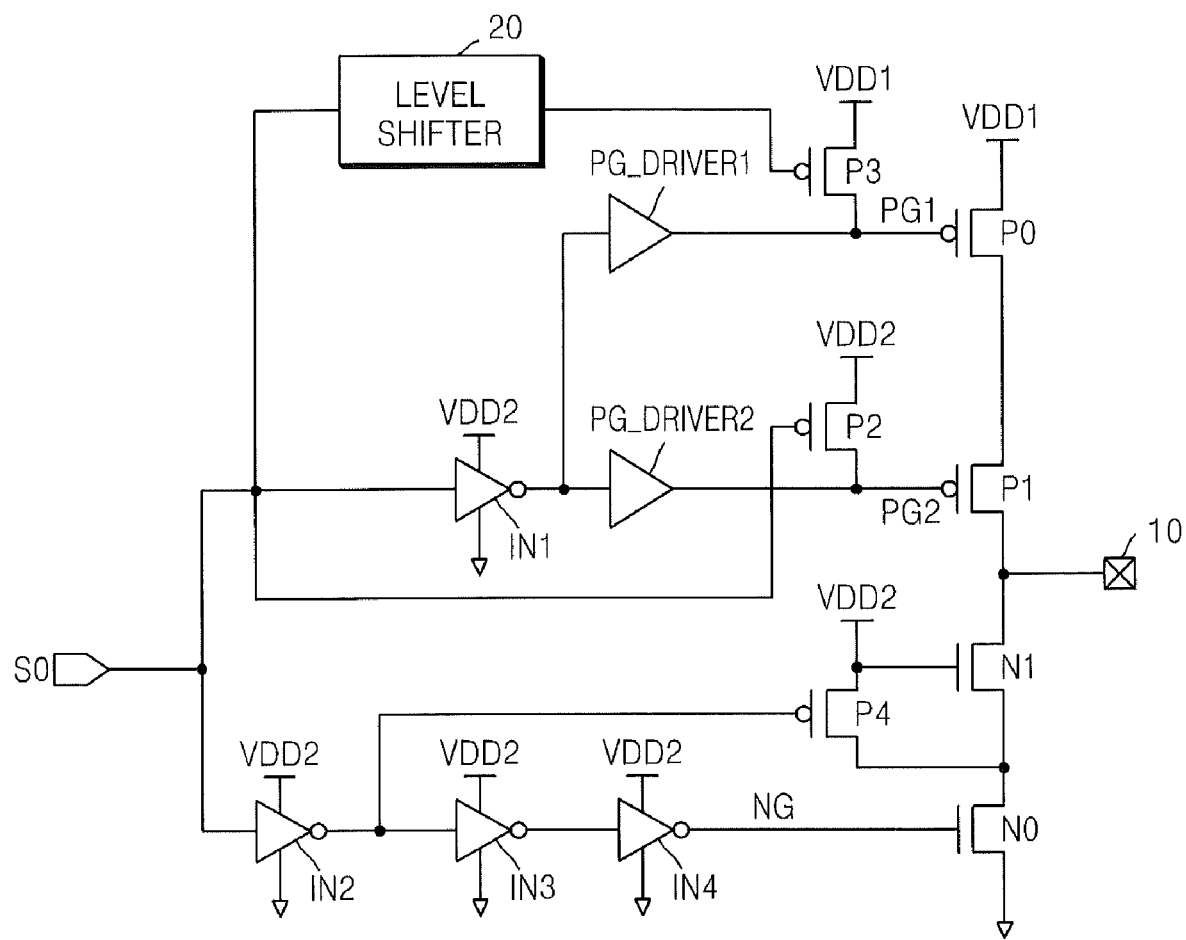
FIG. 2 is a complete circuit diagram of the output driver of FIG. 1.

FIG. 2 is a circuit diagram of the output driver of FIG. 1. Referring to FIG. 2, the output driver includes a level shifter 20, two gate drivers PG_DRIVER1 and PG_DRIVER2; a plurality of inverters IN1 through IN4, a plurality of PMOS transistors P0 through P4, and a plurality of NMOS transistors N0 and N1. The PMOS transistors P0 through P3 and the NMOS transistors N0 and N1 are respectively the same as the PMOS transistors P0 through P3 and the NMOS transistors N0 and N1 of FIG. 1.

The PMOS transistor P4 is added to the pull-down circuit of FIG. 1 in order to prevent overvoltage from being applied to the NMOS transistor N1 of the pull-down circuit.

That is, since a voltage of a source terminal of the NMOS transistor N1 is VDD2−Vtn when the NMOS transistor N0 is turned off, a source-drain voltage Vds of the NMOS transistor N1 may be higher than a rated voltage. Here, Vtn is a gate-source threshold voltage of the NMOS transistor N1.

Accordingly, as shown in FIG. 2, a source terminal and a drain terminal of the PMOS transistor P4 are respectively connected to the gate terminal and the source terminal of the NMOS transistor N1, and an output terminal of the inverter IN2 is connected to a gate terminal of the PMOS transistor P4. Accordingly, when the NMOS transistor N0 is turned off, the PMOS transistor P4 is turned on and a voltage of the source terminal of the NMOS transistor N1 becomes the second supply voltage VDD2. Accordingly, the source-drain voltage Vds of the NMOS transistor N1 can be prevented from exceeding the rated voltage.

The level shifter 20 is a circuit for shifting a supply voltage signal. The configuration of the level shifter 20 is shown in FIG. 5.

Figure 3:
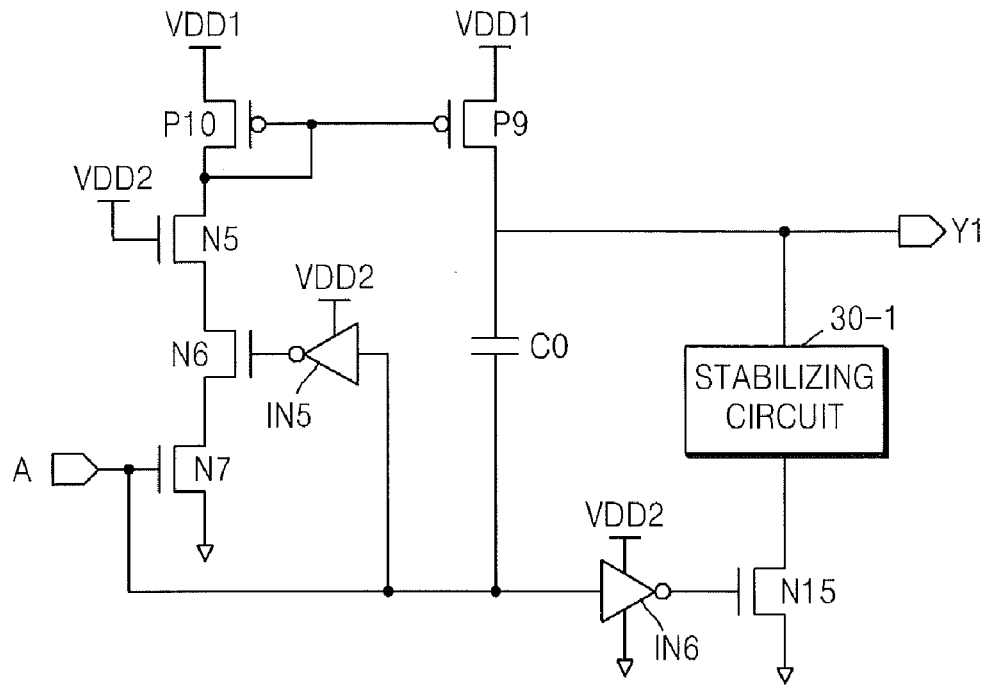
FIG. 3 is a circuit diagram illustrating a gate driver of the output driver of FIG. 2.
Figure 5:
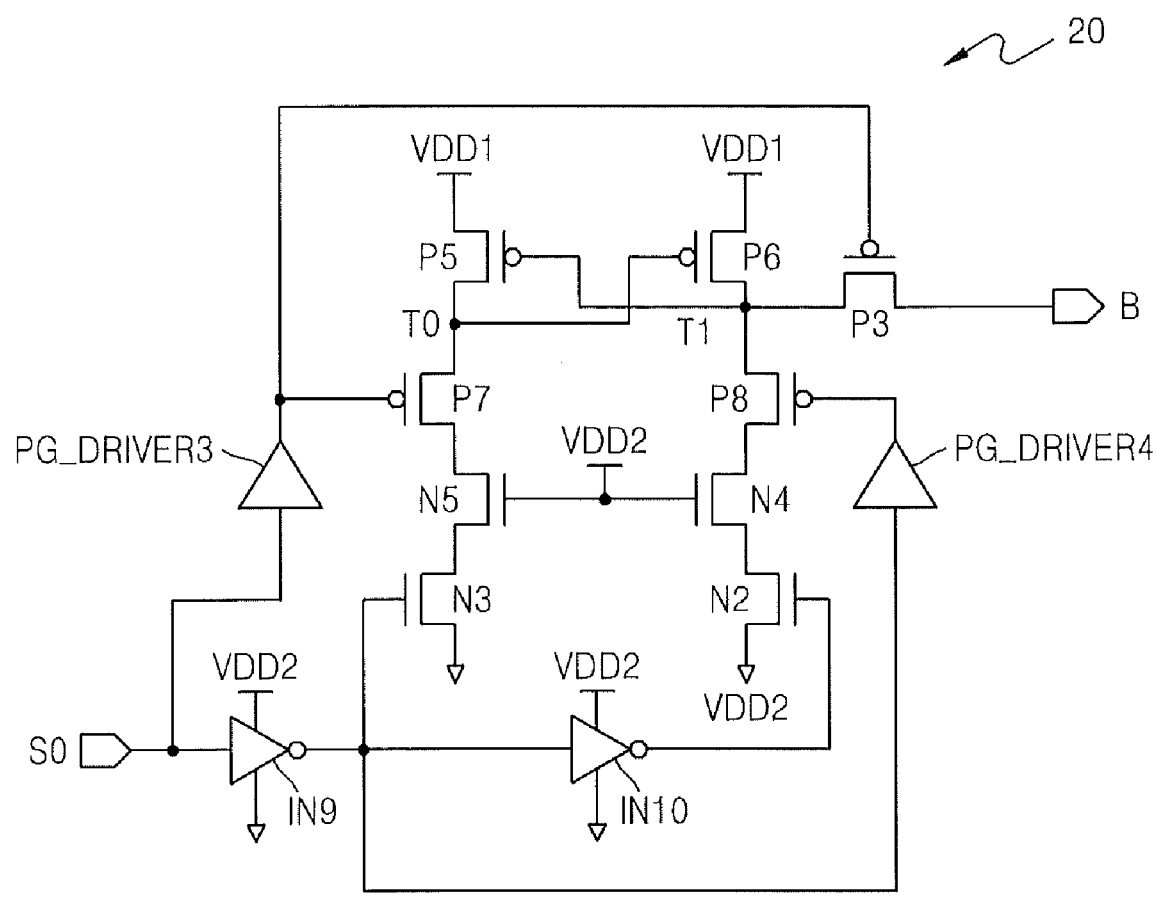
FIG. 5 is a circuit diagram illustrating a level shifter of the output driver of FIG. 2.

FIG. 5 is a circuit diagram of the level shifter 20 of the output driver of FIG. 2. Referring to FIG. 5, the level shifter 20 includes gate drivers PG_DRIVER3 and PG_DRIVER4, inverters IN9 and IN10, PMOS transistors P3, P5 through P8, and NMOS transistors N2 and N3. The gate drivers PG_DRIVER3 and PG_DRIVER4 constitute a circuit for changing a signal swinging between the ground voltage of 0 V and the second supply voltage VDD2 to a signal swinging between the first supply voltage VDD1 and a voltage that is higher than the ground voltage of 0 V and lower than the first supply voltage VDD1 and can turn on a PMOS transistor by being applied to a gate terminal of the PMOS transistor. The circuit may be configured as shown in FIG. 3, and a detailed explanation thereof will be provided below.

Operations of the level shifter 20 of FIG. 5 will now be explained. If a signal S0 is 0 V, that is, a voltage of a low level, an output voltage of the inverter IN9 is the second supply voltage VDD2, that is, a voltage of a high level, and an output voltage of the inverter IN10 is the ground voltage of 0 V, that is, a voltage of a low level. Accordingly, the NMOS transistor N3 is turned on and the NMOS transistor N2 is turned off. The gate driver PG_DRIVE3 generates a voltage that is higher than the ground voltage of 0 V and can turn on the PMOS transistors P7 and P3. Accordingly, the PMOS transistors P7 and P3 are turned on, and the second supply voltage VDD2 is applied to a gate terminal of the NMOS transistor N5 to turn on the NMOS transistor N5.

Also, the gate driver PG_DRIVER4 inputs the second supply voltage VDD2, and outputs the first supply voltage VDD1 through an output terminal. Accordingly, the PMOS transistor P8 is turned off.

Accordingly, since the PMOS transistor P5 is turned off and the PMOS transistor P6 is turned on, a voltage of a source terminal of the PMOS transistor P3 becomes the first supply voltage VDD1. The PMOS transistor P3 is turned on, and a voltage of a node B, that is, a drain terminal of the PMOS transistor P3 becomes the first supply voltage VDD1.

If the signal S0 is the second supply voltage VDD2, that is, a voltage of a high level, the output voltage of the inverter IN9 becomes the ground voltage of 0 V, that is, a voltage of a low level, and the output voltage of the inverter IN10 becomes the second supply voltage VDD2, that is, a voltage of a high level. Accordingly, the NMOS transistor N3 is turned off and the NMOS transistor N2 is turned on. A voltage of an output terminal of the gate driver PG_DRIVER3 becomes the first supply voltage VDD1, and a voltage of the output terminal of the gate driver PG_DRIVER 4 becomes a voltage that is higher than the ground voltage of 0 V and can turn on the PMOS transistor P8.

Accordingly, the PMOS transistors P7 and P3 are turned off, and the transistors N2 and P8 are turned on. Of course, the second supply voltage VDD2 is applied to the gate terminal of the NMOS transistor N4, and thus the NMOS transistor N4 is turned on. Accordingly, the PMOS transistor P5 is turned on, and the PMOS transistor P6 is turned off.

The voltage of the output terminal of the gate driver PG_DRIVER3 becomes the first supply voltage VDD1, and thus the PMOS transistor P3 is turned off. Accordingly, the PMOS transistor P3 is in a high impedance state, and the voltage of the node B is determined according to a circuit connected to the node B.

The gate driver PG_DRIVER1 is a circuit for generating a signal to be applied to the gate terminal PG1 of the PMOS transistor P0 of a pull-up circuit. The configuration of the gate driver PG_DRIVER1 is shown in FIG. 3.

FIG. 3 is a circuit diagram illustrating the gate driver PG_DRIVER1 of the output driver of FIG. 2. Referring to FIG. 3, the gate driver PG_DRIVER1 includes a plurality of PMOS transistors P9 and P10, a plurality of NMOS transistors N5, N6, N7, and N15, a capacitor C0, inverters IN5 and IN6, and a stabilizing circuit 30-1. A first supply voltage source is connected to a source terminal of each of the PMOS transistors P9 and P10.

The operation of the gate driver PG_DRIVER1 of FIG. 3 will now be explained.

A node A is connected to an output terminal of the inverter IN1 of FIG. 2, and a node Y1 is connected to a drain terminal of the PMOS transistor P3 of FIG. 2 and to the gate terminal PG1 of the PMOS transistor P0.

When a signal of the node A changes from a low-level voltage (0 V) state to a high-level voltage (VDD2) state, the NMOS transistors N6 and N7 are turned on until a voltage of an output terminal of the inverter IN5 changes from a voltage of a high level (VDD2) to a voltage of a low level (0 V). Since the NMOS transistor N5 is always turned on, the PMOS transistor P10 is turned on. Accordingly, the PMOS transistors P10 and P9 constitute a mirror circuit, the PMOS transistor P9 is turned on, and a voltage of the node Y1 becomes the first supply voltage VDD1.

When a signal of the node A changes from a high-level voltage (VDD2) state to a low-level voltage (0 V) state, the NMOS transistor N7 is turned off and the PMOS transistors P10 and P9 are turned off.

Since the PMOS transistor P3 of FIG. 2 is in an on state until a signal of the node A changes from a voltage of a high level (VDD2) to a voltage of a low level (0 V), a voltage of the node A is still the second supply voltage VDD2. Of course, a voltage of a terminal of the capacitor C0 connected to the node A becomes the second supply voltage VDD2.

Accordingly, when the signal of the node A changes from a high-level voltage (VDD2) state to a low-level voltage (0 V) state, the voltage of the terminal of the capacitor C0 connected to the node A is changed from the second supply voltage VDD2 to the ground voltage of 0 V. Accordingly, a voltage of the node Y1 is expressed as Equation 2 based on charge sharing between the capacitor C0 and the internal capacitor Cg(P0) of the PMOS transistor P0 (see FIG. 1 or 2) connected to the node Y1.

Without considering the stabilizing circuit 30-1, a voltage suitable for driving the PMOS transistor P0 is generated when a signal applied to the node A is in an alternating current (AC) state. However, the node Y1 is floating when the signal applied to the node A is maintained in a direct current (DC) state, and a logic state of the node Y1 is determined by a leakage current of a device connected to the node Y1.

The stabilizing circuit 30-1 is a circuit for preventing the node Y1 from floating when the signal applied to the node A is maintained in the DC state. The configuration of the stabilizing circuit 30-1 is illustrated in FIG. 6.

Figure 6:
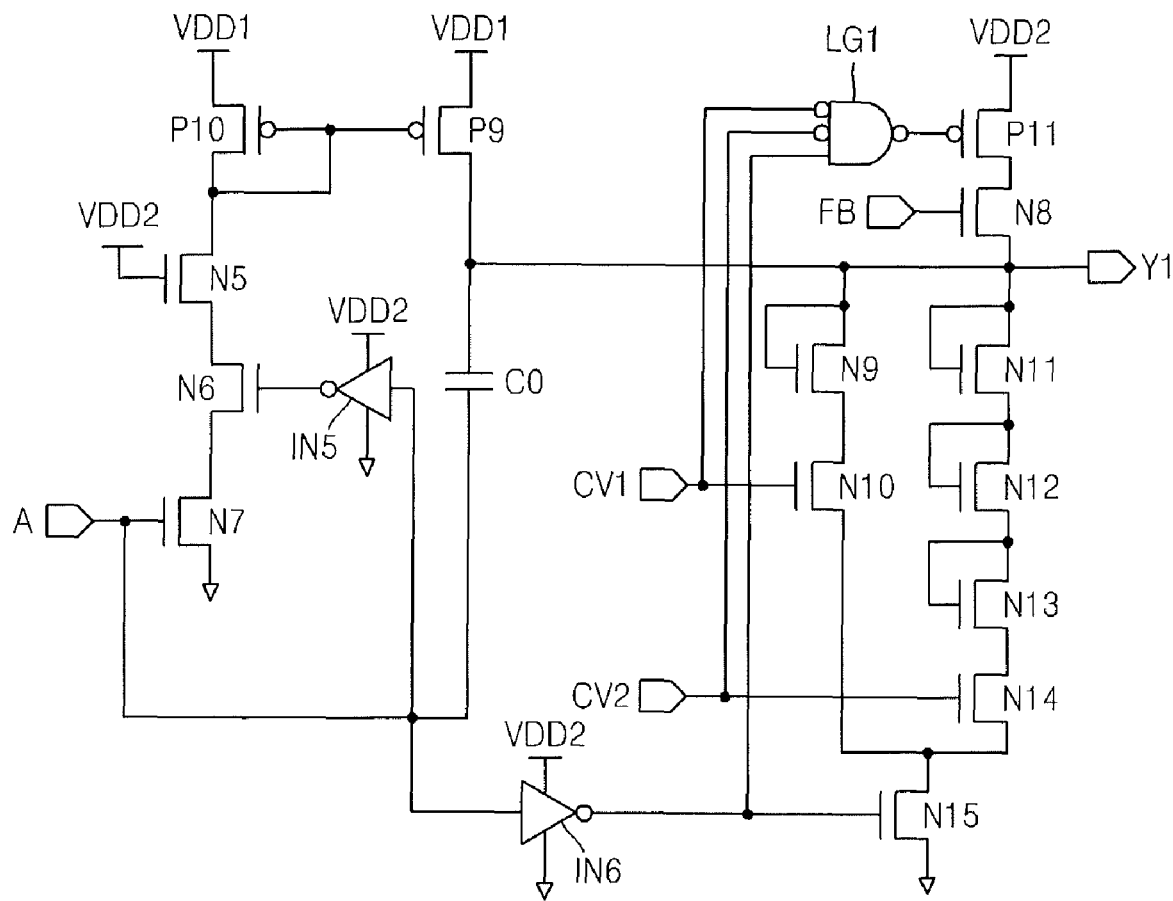
FIG. 6 is a circuit diagram illustrating a stabilizing circuit of the gate driver of FIG. 3.

FIG. 6 is a circuit diagram illustrating the stabilizing circuit 30-1 of the gate driver PG_DRIVER1 of FIG. 3. Referring to FIG. 6, the stabilizing circuit 30-1 includes a logic gate circuit LG1, a PMOS transistor P11, and a plurality of NMOS transistors N9 through N14, and is coupled to an NMOS transistor N15 and an inverter IN6.

Elements other than the stabilizing circuit 30-1 of FIG. 6 are the same as those illustrated in FIG. 3.

CV1 and CV2 are control signals for determining a voltage of the node Y1, which is an output terminal of the stabilizing circuit 30-1, in a floating state.

For example, it is assumed that if the first supply voltage VDD1 is 3.3 V, the control signal CV1 is a signal having a low logic level and the control signal CV2 is a signal having a low logic level, if the first supply voltage VDD1 is 2.5 V, the control signal CV1 is a signal having a low logic level and the control signal CV2 is a signal having a high logic level, and if the first supply voltage VDD1 is 1.8 V, the control signal CV1 is a signal having a high logic level and the control signal CV2 is a signal having a low logic level.

Figure 9:
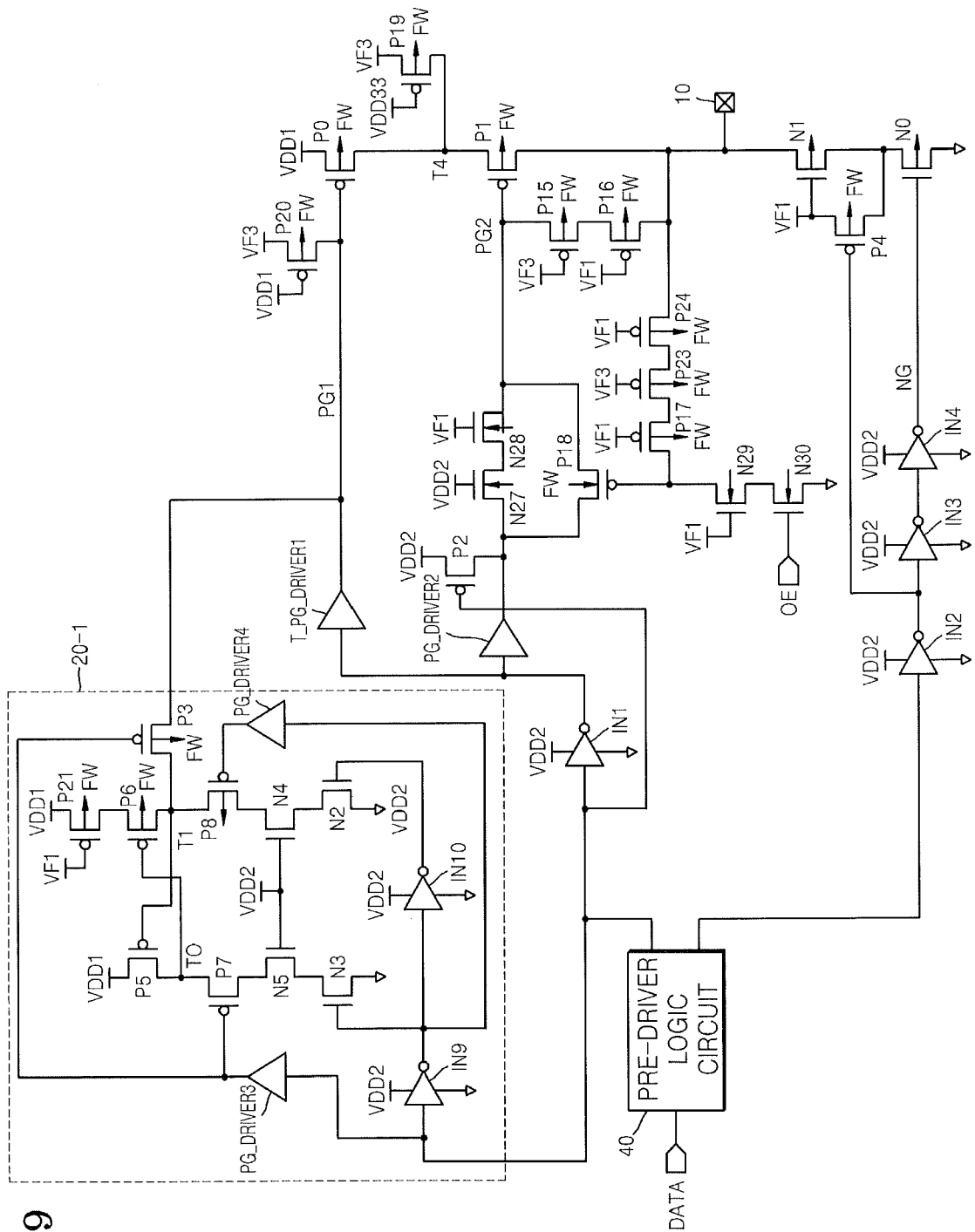
FIG. 9 is a circuit diagram of the output driver of FIG. 2 which can perform a tolerant function and a fail-safe function using the control signals of FIG. 8.

A terminal FB is connected to a node T0 of a circuit of FIG. 9. Accordingly, when the first supply voltage VDD1 is 3.3 V and a signal of the node A is maintained in a DC 0V state, the NMOS transistors N10 and N14 are turned off, and the logic gate circuit LG1 outputs a signal having a low logic level. Accordingly, the transistors P11 and N8 are turned on, and a voltage of the node Y1 becomes the second supply voltage VDD2.

When the first supply voltage VDD1 is 2.5 V and a signal of the node A is maintained in a DC 0 V state, the logic gate circuit LG1 outputs a signal having a high logic level and the PMOS transistor P11 is turned off. The NMOS transistor N10 is turned off, and the NMOS transistors N14 and N15 are turned on. Accordingly, a voltage of the node Y1 becomes 3*Vtn. Here, Vtn is a threshold voltage of each of the diodes of the NMOS transistors N11 through N13.

Likewise, when the first supply voltage is 1.8 V and a signal of the node A is maintained in a DC 0 V state, a voltage of the node Y1 becomes Vtn.

Accordingly, the node Y1 can be prevented from floating due to the stabilizing circuit 30-1 of FIG. 6.

Referring to FIG. 2 again, the gate driver PG-DRIVER2 is a circuit for generating a signal to be applied to the gate terminal PG2 of the PMOS transistor P1 of the pull-up circuit. The configuration of the gate driver PG-DRIVER2 is shown in FIG. 4.

Figure 4:
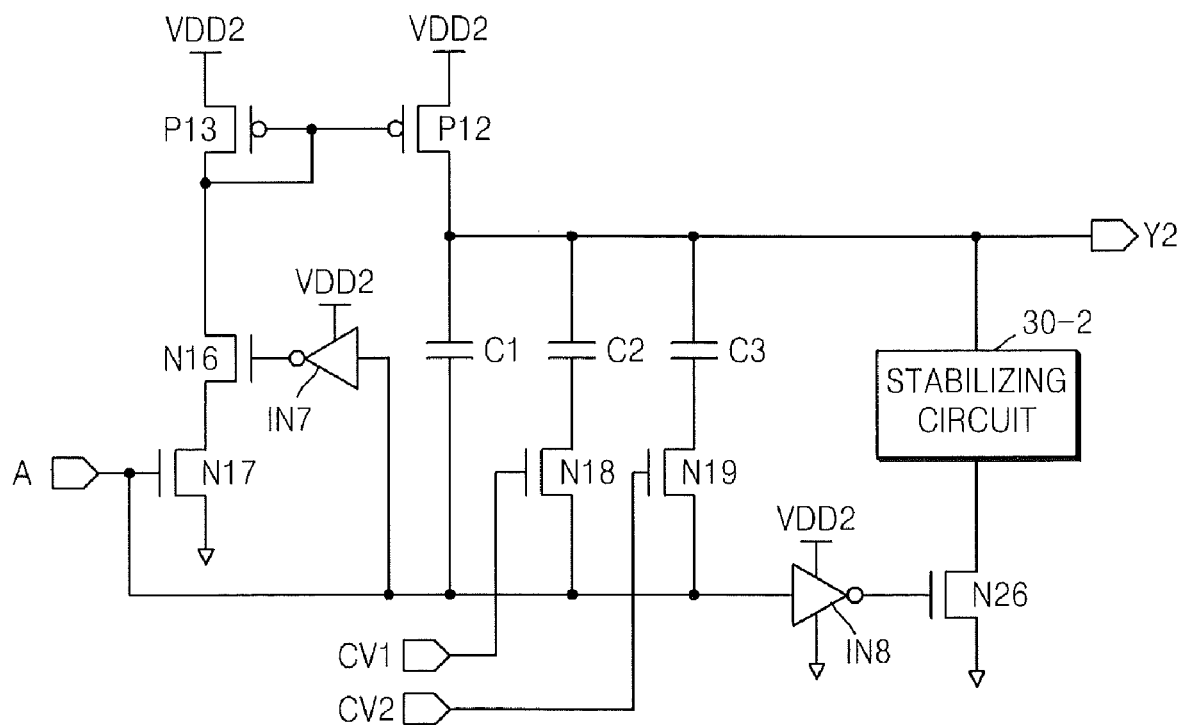
FIG. 4 is a circuit diagram illustrating another gate driver of the output driver of FIG. 2.

FIG. 4 is a circuit diagram illustrating the gate driver PG_DRIVER 2 of the output driver of FIG. 2. Referring to FIG. 4, the gate driver PG_DRIVER2 includes a plurality of PMOS transistors P12 and P13, a plurality of NMOS transistors N16, N17, N18, and N26, a plurality of capacitors C1, C2, and C3, inverters IN7 and IN8, and a stabilizing circuit 30-2. A second supply voltage source is connected to a source terminal of each of the PMOS transistors P12 and P13.

The operation of the gate driver PG_DRIVER2 of FIG. 4 will now be explained.

The node A is connected to the output terminal of the inverter IN1 of FIG. 2, and a node Y2 is connected to the gate terminal PG2 of the PMOS transistor P1 and to the drain terminal of the PMOS transistor P2 of FIG. 2.

When a signal of the node A changes from a low-level voltage (0 V) state to a high-level voltage (VDD2) state, the NMOS transistors N16 and N17 are turned on until a voltage of an output terminal of the inverter IN7 changes from a voltage of a high level (VDD2) to a voltage of a low level (0 V). Accordingly, the PMOS transistors P13 and P12 constitute a mirror circuit, the PMOS transistors P13 and P12 are turned on, and a voltage of the node Y2 becomes the second supply voltage VDD2.

When a signal of the node A changes from a high-level voltage (VDD2) state to a low-level voltage (0 V) state, the NMOS transistor N17 is turned off and the PMOS transistors P13 and P12 are turned off.

Since the PMOS transistor P2 of FIG. 2 is in an on state until a signal of the node A changes from a voltage of a high level (VDD2) to a voltage of a low level (0 V), a voltage of the node A is still the second supply voltage VDD2. Of course, a voltage of a terminal of the capacitor C1 connected to the node A becomes the second supply voltage VDD2.

Accordingly, when the signal of the node A changes from a high-level voltage (VDD2) state to a low-level voltage (0 V) state, the voltage of the terminal of the capacitor C1 connected to the node A is changed from the second supply voltage VDD2 to the ground voltage of 0 V. Accordingly, a voltage of the node Y2 is expressed as Equation 2 based on charge sharing between the capacitor C1 and the internal capacitor Cg(P1) of the PMOS transistor P1 (see FIG. 1 or 2) connected to the node Y2.

The capacitors C2 and C3 are used to adjust the voltage of the node Y2 when the first supply voltage VDD1 is changed. For example, if the first supply voltage VDD changes from 3.3 V to 2.5 V, an NMOS transistor N19 is in an on state and the voltage of the node Y2 is determined according to values of the capacitors C1 and C3.

Without considering the stabilizing circuit 30-2, a voltage suitable for driving the PMOS transistor P1 is generated when a signal applied to the node A is in an AC state. However, the node Y2 is floating when the signal applied to the node A is maintained in a DC state, and a logic state of the node Y2 is determined by a leakage current of a device connected to the node Y2. If the first supply voltage VDD1 changes from 3.3 V to 1.8 V, the NMOS transistor N18 is turned on and thus the voltage of the node Y2 is determined according to values of the capacitors C1 and C2.

The stabilizing circuit 30-2 is a circuit for preventing the node Y2 from floating when the signal applied to the node A is maintained in the DC state. The configuration of the stabilizing circuit 30-2 is illustrated in FIG. 7.

Figure 7:
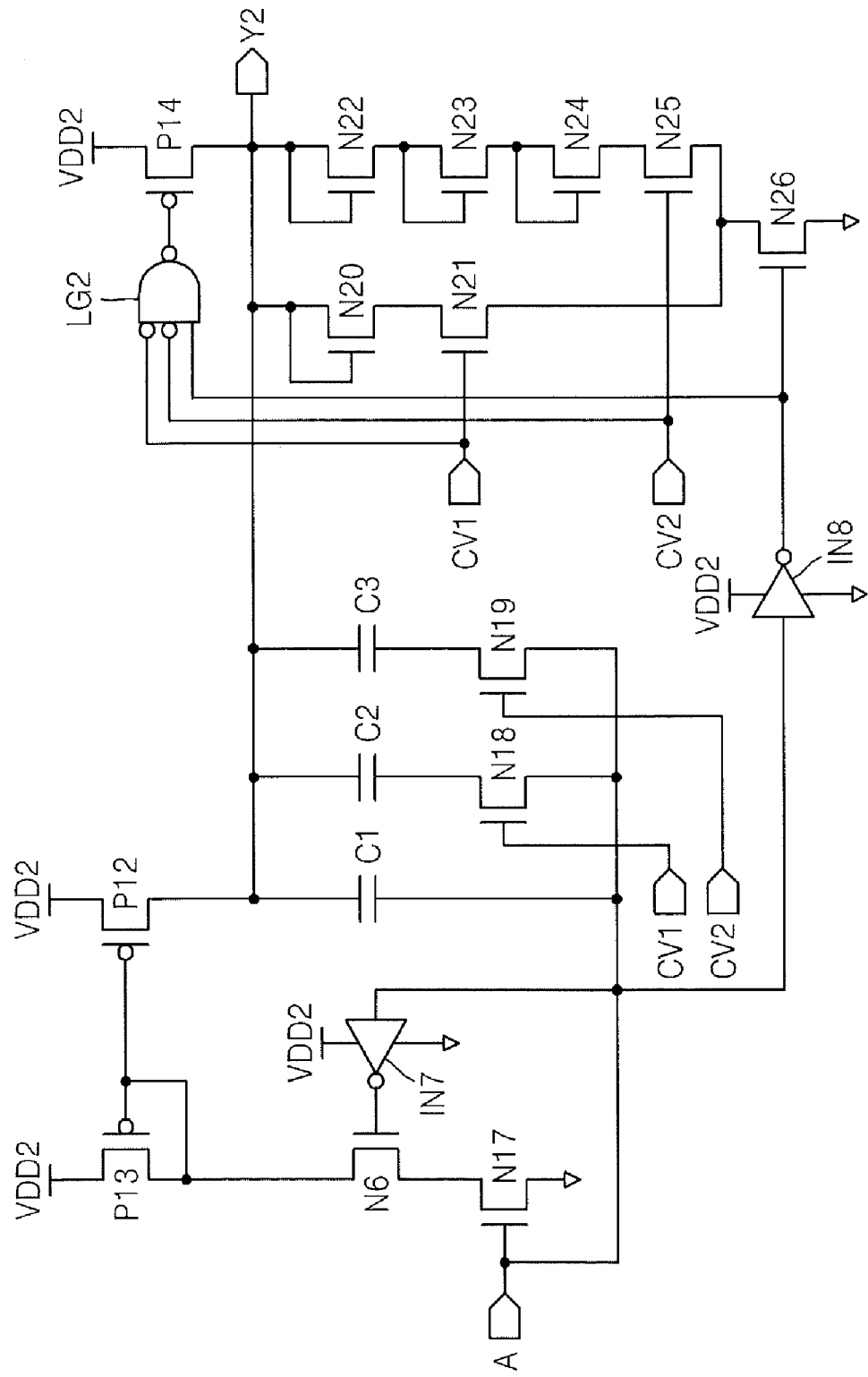
FIG. 7 is a circuit diagram illustrating a stabilizing circuit of the gate driver of FIG. 4.

FIG. 7 is a circuit diagram illustrating the stabilizing circuit 30-2 of the gate driver PG_DRIVER 2 of FIG. 4. Referring to FIG. 7, the stabilizing circuit 30-2 includes a logic gate circuit LG2, a PMOS transistor P14, and a plurality of NMOS transistors N20 through N25, and is coupled to an NMOS transistor N26 and an inverter IN8.

Elements other than the stabilizing circuit 30-2 are the same as those illustrated in FIG. 4.

CV1 and CV2 are control signals for determining a voltage of the node Y2, that is, an output terminal of the stabilizing circuit 30-2, in a floating state.

For example, it is assumed that if the first supply voltage VDD1 is 3.3 V, the control signal CV1 is a signal having a low logic level and the control signal CV2 is a signal having a low logic level, if the first supply voltage VDD1 is 2.5 V, the control signal CV1 is a signal having a low logic level and the control signal CV2 is a signal having a high logic level, and if the first supply voltage VDD1 is 1.8 V, the control signal CV1 is a signal having a high logic level and the control signal CV2 is a signal having a low logic level.

When the first supply voltage is 3.3 V and a signal of the node A is maintained in a DC 0 V state, the NMOS transistors N21 and N25 are turned off and the logic gate circuit LG2 outputs a signal having a low logic level. Accordingly, the PMOS transistor P14 is turned on, and a voltage of the node Y2 becomes the second supply voltage VDD2.

When the first supply voltage VDD1 is 2.5 V and a signal of the node A is maintained in a DC 0 V state, the logic gate circuit LG2 outputs a signal having a high logic level and the PMOS transistor P14 is turned off. The NMOS transistor N21 is turned off, and the NMOS transistors N25 and N26 are turned on. Accordingly, a voltage of the node Y2 becomes 3*Vtn, where Vtn is a threshold voltage of each of diodes of the NMOS transistors N22 through N24.

Likewise, when the first supply voltage VDD1 is 1.8 V and a signal of the node A is maintained in a DC 0 V state, a voltage of the node Y2 becomes Vtn.

Accordingly, the node Y2 can be prevented from floating due to the stabilizing circuit 30-2 of FIG. 7.

Referring to FIG. 2 again, if the signal S0 is a signal swinging between the ground voltage of 0 V and the second supply voltage VDD2, the following operation is performed according to the configuration of the level shifter 20 of FIG. 5 and the gate drivers PG_DRIVER1 and PG_DRIVER2 of FIGS. 3 and 4.

The following operation is performed when the signal S0 changes to the ground voltage of 0 V, that is, a voltage of a low level.

A voltage that is higher than the ground voltage of 0 V and lower than the first supply voltage VDD1 and can turn on the PMOS transistor P3 is applied to the gate terminal of the PMOS transistor P3 due to the level shifter 20. Accordingly, the PMOS transistor P3 is turned on, and the first supply voltage VDD1 is applied to the gate terminal PG 1 of the PMOS transistor P0. Accordingly, the PMOS transistor P0 is turned off.

The PMOS transistor P2 is turned on, and the second supply voltage VDD2 is applied to the gate terminal PG2 of the PMOS transistor P1.

Also, the second supply voltage VDD2 is applied to the gate terminal of the PMOS transistor P4, and the PMOS transistor P4 is turned off. The second supply voltage VDD2 is applied to a gate terminal of the NMOS transistor N0, the NMOS transistor N0 is turned on, and the NMOS transistor N1 is turned on, and the pad 10 is pulled down to the ground voltage of 0 V.

If the signal S0 changes to the second supply voltage VDD2, that is, a voltage of a high level, the following operation is performed.

The first supply voltage VDD1 is applied to the gate terminal of the PMOS transistor P3 due to the level shifter 20. Accordingly, the PMOS transistor P3 is turned off and in a high impedance state. The voltage PG1_LOW of the gate terminal PG1 of the PMOS transistor P0 is expressed as Equation 2 due to the gate driver PG_DRIVER1. The PMOS transistor P0 is turned on due to the voltage PG1_LOW. The voltage PG2_LOW of the gate terminal PG2 of the PMOS transistor P1 is expressed as Equation 1 due to the gate driver PG_DRIVER2. The PMOS transistor P1 is turned on due to the voltage PG2_LOW.

Also, the NMOS transistor N0 is turned off, and the pad 10 is pulled up to the first supply voltage VDD1.

Accordingly, as shown in Equations 1 and 2, a sufficient source-gate voltage for driving a PMOS transistor can be generated without causing overvoltage to the gate-oxide of the PMOS transistor by adjusting the values of the capacitors C0 and C1.

The gate-oxide of the PMOS transistor P0 does not suffer problems when a voltage of the gate terminal PG1 of the PMOS transistor P0, that is, a node of the pull-up circuit, is in a range from (VDD1-VDD2) to the second supply voltage VDD2, since a gate-source voltage difference of the PMOS transistor P0 is the same as a gate-source voltage difference of the NMOS transistor N0 and impedances of the pull-up circuit and the pull-down circuit can be maintained similar to each other. Referring to Equation 2, a value of the capacitor C0 needs to be higher than that of the internal capacitor Cg(P0).

A circuit for enabling a circuit to have a fail-safe function and a tolerant function necessary to prevent current from flowing from the pad 10 of the output driver to a supply voltage source terminal will now be explained.

A circuit for generating control signals VF1, VF3, and FW which are necessary for the output driver to have a fail-safe function and a tolerant function will be explained.

Figure 8:
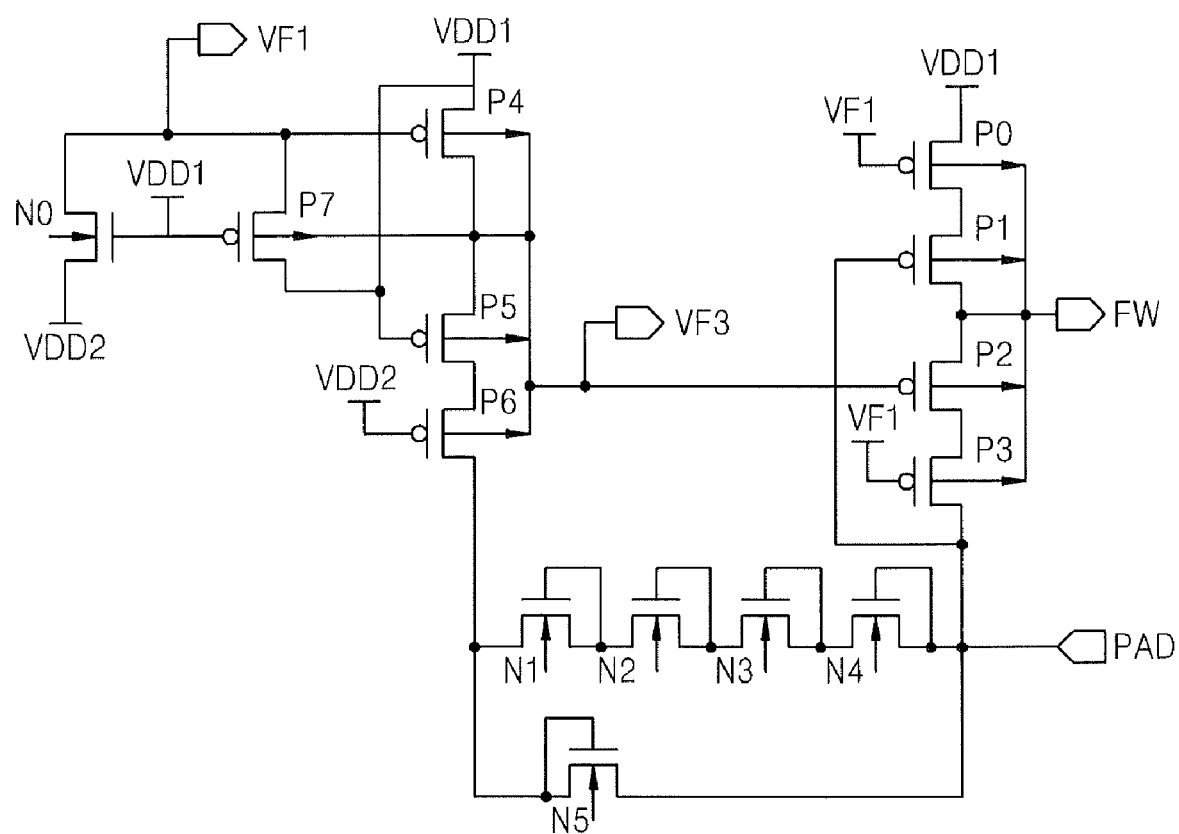
FIG. 8 is a circuit diagram illustrating a circuit for generating control signals for a tolerant function and a fail-safe function of the output driver of FIG. 2, according to some embodiments of the inventive subject matter.

The circuit for generating the control signals VF1, VF3, and FW is illustrated in FIG. 8.

FIG. 8 is a circuit diagram illustrating a circuit for generating control signals for a tolerant function and a fail-safe function of the output driver of FIG. 2, according to some embodiments of the inventive subject matter. The operation of the circuit of FIG. 8 when a first supply voltage source is turned on/off and when the first supply voltage VDD1 is applied to the pad 10 will be explained.

If both the first supply voltage source and a second supply voltage source are turned on, an NMOS transistor N0 is turned on, a PMOS transistor P7 is turned off, and a voltage of a node VF1 becomes the second supply voltage VDD2. The second supply voltage VDD2 is applied to a gate terminal of a PMOS transistor P4 to turn on the PMOS transistor P4, and a node VF3 is charged with the first supply voltage VDD1 through the PMOS transistor P4 to make a voltage of the node VF3 become the first supply voltage VDD1. Since the PMOS transistor P2 is always in an off state in this case, even if the first supply voltage VDD1 is applied to the pad 10, the node VF3 is not affected by the voltage of the pad 10. If the voltage of the pad 10 is lower than the first supply voltage VDD1, PMOS transistors P0 and P1 are turned on, and thus a voltage of the node FW becomes the first supply voltage VDD1. If a voltage of the pad 10 is higher than the first supply voltage VDD1, the PMOS transistor P1 is turned off, PMOS transistors P2 and P3 are turned on, and a voltage of the node FW becomes the same as the voltage of the pad 10.

Second, if both the first supply voltage source and the second supply voltage source are turned off, since NMOS transistors N1, N2, N3, and N4 are connected in a diode configuration when the first supply voltage VDD1 is applied to the pad 10, a voltage that is reduced by 4 times Vtn from a voltage V(PAD) of the pad 10 is applied to a drain terminal of a PMOS transistor P6. Here, Vtn is a diode threshold voltage. In this case, the PMOS transistors P7 is turned on, a voltage of the node VF1 becomes [V(PAD)−4*Vtn], and the same voltage as [V(PAD)−4*Vtn] is applied to the gate terminal of the PMOS transistor P4 to turn off the PMOS transistor P4, thereby preventing overvoltage from being applied to an oxide.

A circuit for performing a fail-safe function and a tolerant function by applying the control signals VF1, VF3, and FW generated in the circuit of FIG. 8 to the output driver will now be explained with reference to FIG. 9.

FIG. 9 is a circuit diagram illustrating the output driver of FIG. 2 which can perform a fail-safe function and a tolerant function using the control signals VF1, VF3, and FW.

Referring to FIG. 9, NMOS transistors N27 through N30 and PMOS transistors P15 through P22 are added to the output driver of FIG. 2.

For reference, a pre-driver logic circuit 40 is also added to the output driver of FIG. 2. The pre-driver logic circuit 40 is a circuit for outputting a signal corresponding to a logic value of data DATA through different terminals when an output enable signal OE is applied to the pre-driver logic circuit 40.

The operation of the output driver having the fail-safe function and the tolerant function will be explained in detail.

If a signal of a voltage that is higher than the first supply voltage VDD1 is applied to the pad 10, a voltage of the node VF1 becomes the second supply voltage VDD2, a voltage of the node VF3 becomes the first supply voltage VDD1, and a voltage of the node FW becomes a pad voltage. Accordingly, the PMOS transistors P15 and P16 are turned on, and a voltage of the gate terminal PG2, which is a node, of the PMOS transistor P1, becomes the pad voltage. Accordingly, the PMOS transistor P1 is turned off, thereby preventing current from flowing to a first supply voltage source terminal.

If the first supply voltage source and the second supply voltage source are turned off and the first supply voltage VDD1 is applied to the pad 10, voltages of the nodes VF1 and VF3 become [V(PAD)−4*Vth] and a voltage of the node FW becomes the pad voltage. Accordingly, the PMOS transistors P15 and P16 are turned on and the voltage PG2 becomes the pad voltage. Accordingly, the PMOS transistor P1 is turned off, thereby preventing current from flowing to the first supply voltage source terminal. If a voltage of a node T4 is about the ground voltage of 0 V, overvoltage may be applied to the oxide of the PMOS transistor P1. Accordingly, a voltage of the node T4 is determined to be [V(PAD)−4*Vth] using the PMOS transistor P19. A voltage of the gate terminal PG1, which is a node, becomes [V(PAD)−4*Vth] using the PMOS transistor P20 to turn off the transistor P0. A voltage of [V(PAD)−4*Vth] is applied to gate terminals of the PMOS transistors P21 and P22, thereby preventing current from flowing to the first supply voltage source terminal. Accordingly, overvoltage can be prevented from being applied to both the ends of the oxide of each PMOS transistor.

Figure 10:
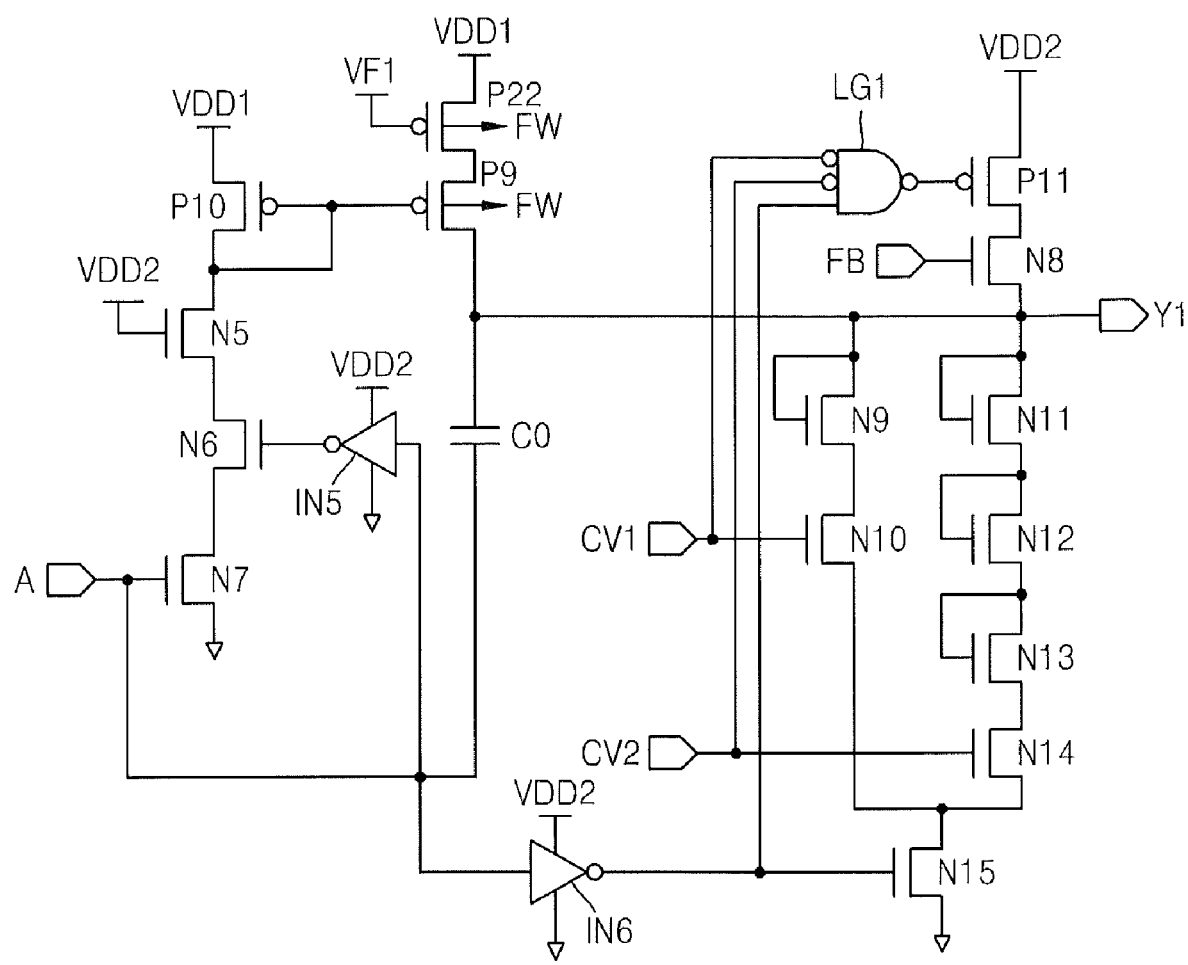
FIG. 10 is a circuit diagram illustrating a gate driver of the output driver of FIG. 9.

As described above, current can be prevented from flowing to the first supply voltage source terminal due to a signal applied to the pad 10 using the PMOS transistor P22 added to a gate driver T_PG_DRIVER1 of FIG. 10 and a transistor P21 added to a level shifter 20-1.

While the inventive subject matter has been particularly shown and described with reference to exemplary embodiments thereof, it will be understood by one of ordinary skill in the art that various changes in form and details may be made therein without departing from the spirit and scope of the inventive subject matter as defined by the following claims.

What is claimed is:

1. An output driver comprising:
    a pull-up circuit and a pull-down circuit coupled to an output terminal;
    a capacitor having a first terminal coupled to a gate terminal of a P-channel transistor of the pull-up circuit and a second terminal configured to receive a drive signal; and
    a drive circuit coupled to the first terminal of the capacitor and configured to transfer charge from a power supply node to the first terminal of the capacitor when the drive signal is at a signal ground voltage and to decouple the first terminal of the capacitor from the power supply node when the drive signal is at a voltage level greater than the signal ground voltage such that a voltage swing of a signal generated at the gate terminal of the P-channel transistor is constrained to be less than a voltage of the power supply node with respect to the signal ground voltage.

2. The output driver of claim 1, wherein the pull-up circuit is coupled between the output terminal and the power supply node and wherein the drive circuit comprises a PMOS transistor having a source terminal coupled to the power supply node, a drain terminal coupled to the first terminal of the capacitor and a gate terminal configured to receive a signal complementary to the drive signal.

3. The output driver of claim 1, wherein the pull-up circuit is coupled between the output terminal and a first power supply node and wherein the drive circuit comprises a PMOS transistor having a source terminal coupled to a second power supply node, a drain terminal coupled to the first terminal of the capacitor and a gate terminal configured to receive a signal complementary to the drive signal.

4. The output driver of claim 3, wherein the second power supply node has a voltage less than a voltage of the first power supply node.

5. The output driver of claim 1:
    wherein the pull-up circuit comprises:
        a first PMOS transistor having a source terminal coupled to a first power supply node; and a second PMOS transistor having a source terminal coupled to a drain terminal of the first PMOS transistor and a drain terminal coupled to the output terminal;

wherein the capacitor comprises:
a first capacitor having a first terminal coupled to a gate terminal of the first PMOS transistor and a second terminal configured to receive a first drive signal;
a second capacitor having a first terminal coupled to a gate terminal of the second PMOS transistor and a second terminal configured to receive a second drive signal; and wherein the drive circuit comprises:
a third PMOS transistor having a source terminal coupled to the first power supply node, a drain terminal coupled to the first terminal of the first capacitor and a gate terminal configured to receive a signal complementary to the first drive signal;
a fourth PMOS transistor having a source terminal coupled to a second power supply node, a drain terminal coupled to the first terminal of the second capacitor and a gate terminal configured to receive a signal complementary to the second drive signal.

6. The output driver of claim 5, wherein the second power supply node has a voltage less than a voltage of the first power supply node.

7. An output driver comprising:
a pull-up/pull-down circuit comprising one or more P-channel transistors connected between a first supply voltage terminal and an output terminal in a cascode configuration and one or more N-channel transistors connected between the output terminal and a ground terminal in a cascode configuration and configured to determine a voltage of the output terminal according to voltages of signals applied to gate terminals of the one or more P-channel transistors and the one or more N-channel transistors; and
a gate voltage adjusting circuit comprising at least one capacitor connected between a terminal to which a first signal swinging between a first voltage and a second supply voltage that is lower than a first supply voltage is applied and the gate terminals of the one or more P-channel transistors included in the pull-up/pull-down circuits and configured to change the first signal to a second signal swinging between the first voltage and a second voltage that is higher than the first voltage and lower than the first supply voltage or to a third signal swinging between the second supply voltage and a third voltage that is higher than the first voltage and lower than the second supply voltage based on charge sharing between internal capacitors of the one or more P-channel transistors and the capacitor to apply the second signal or the third signal to the gate terminals of the one or more P-channel transistors included in the pull-up/pull-down circuits.

8. The output driver of claim 7, wherein the gate voltage adjusting circuit comprises:
a first capacitor connected between a terminal to which the first signal is applied and a first node; and
a P-channel transistor having a first terminal connected to the first supply voltage source terminal, a second terminal connected to the first node, and a gate terminal to which a fourth signal swinging between the first supply voltage and a fourth voltage that is higher than the first voltage and lower than the first supply voltage is applied,
wherein the first node is connected to the gate terminals of the one or more P-channel transistor included in the pull-up/pull-down circuits, and the fourth signal and the first signal are complementary.

9. The output driver of claim 7, wherein the gate voltage adjusting circuit comprises:
a second capacitor connected between a terminal to which the first signal is applied and a second node; and
a P-channel transistor having a first terminal connected to the second supply voltage source terminal, a second terminal connected to the second node, and a gate terminal to which a fifth signal swinging between the second supply voltage and a fifth voltage that is higher than the first voltage and lower than the second supply voltage is applied,
wherein the second node is connected to the gate terminals of the one or more P-channel transistors included in the pull-up/pull-down circuits, and the fifth signal and the first signal are complementary.

10. The output driver of claim 7, wherein the gate voltage adjusting circuit comprises:
a first circuit receiving the first signal to generate the first supply voltage at a third terminal when the first signal changes from the first voltage to the second supply voltage, to generate the second voltage, which is higher than the first voltage and lower than the first supply voltage, at the third terminal when the first signal changes from the second supply voltage to the first voltage, and making the third terminal float when the first signal is maintained in a direct current (DC) state; and
a stabilizing circuit maintaining the third terminal at an initially set voltage in a floating state when the first signal is maintained in the DC state.

11. The output driver of claim 7, wherein the pull-up/pull-down circuits are configured such that a second supply voltage source terminal is connected to a gate terminal of at least one N-channel transistor from among the one or more N-channel transistors connected in the cascode configuration.

12. The output driver of claim 7, wherein the pull-up/pull-down circuits further comprise a P-channel transistor having a terminal connected to a gate terminal of at least one N-channel transistor from among the one or more N-channel transistors and a second supply voltage source terminal, and connected between a gate terminal and one terminal of the N-channel transistor connected to the second supply voltage terminal,
wherein the second signal having the same phase as that of the first signal is applied to a gate terminal of the P-channel transistor further included in the pull-up/pull-down circuits.

13. The output driver of claim 7, wherein the transistors are designed to operate at the second supply voltage.

14. The output driver of claim 7, wherein the transistors comprise metal oxide semiconductor (MOS) transistors.

15. An output driver comprising:
a control signal generating circuit configured to generate first, second, and third control signals according to an on/off state of a first supply voltage source and a second supply voltage source through current paths due to a plurality of transistors connected between a pad and a first supply voltage source terminal, wherein when both the first supply voltage source and the second supply voltage source are turned on, the first control signal generates a second supply voltage, the second control signal generates a first supply voltage, and the third control signal generates the first supply voltage if a voltage of the pad is higher than the first supply voltage and generates the same voltage as the voltage of the pad if the voltage of the pad is not higher than the first supply voltage, and when both the first supply voltage source and the second supply voltage source are turned off, each of the first and second control signals generates a voltage that is lower by an initially set voltage than the voltage of the pad, and the third control signal generates the same voltage as the voltage of the pad;

a pull-up/pull-down circuit comprising one or more P-channel transistors connected between the first supply voltage source terminal and the pad in a cascode configuration and one or more N-channel transistors connected between the pad and a ground terminal in a cascode configuration, and configured to determine the voltage of the pad according to voltages of signals applied to gate terminals of the one or more P-channel transistors and the one or more N-channel transistors; and a device protecting circuit comprising a plurality of switching units coupled to the pull-up/pull-down circuits and configured to prevent current from flowing to the first supply voltage source terminal from the pad when a voltage that is higher than the first supply voltage is applied to the pad or when the first supply voltage is applied to the pad in the state where the first and second supply voltage sources are turned off by turning on or turning off the plurality of switching units using the first, second, and third signals.

16. The output driver of claim 15, further comprising a gate voltage adjusting circuit configured to change a first signal swinging between a first voltage and the second supply voltage that is lower than the first supply voltage to a second signal swinging between the first supply voltage and a second voltage that is higher than the first voltage and lower than the first supply voltage or to a third signal swinging between the second supply voltage and a third voltage that is higher than the first voltage and lower than the second supply voltage to apply the second signal or the third signal to the gate terminals of the one or more P-channel transistors included in the pull-up/pull-down circuits.

* * * * *